United States Patent
Arai et al.

[11] Patent Number: 5,847,589
[45] Date of Patent: Dec. 8, 1998

[54] PULSE SIGNAL GENERATING DEVICE

[75] Inventors: Takashi Arai; Hiroyuki Kuki; Hiroaki Ue, all of Saitama-ken, Japan

[73] Assignee: Honda Giken Kogyo Kabushiki Kaisha, Tokyo, Japan

[21] Appl. No.: 786,333

[22] Filed: Jan. 23, 1997

[30] Foreign Application Priority Data

Feb. 22, 1996 [JP] Japan ..................... 8-035231

[51] Int. Cl.$^6$ .................................................. H03K 7/08
[52] U.S. Cl. ........................................... 327/175; 327/171
[58] Field of Search .................... 327/172–176, 327/291, 299

[56] References Cited

U.S. PATENT DOCUMENTS

| | | | |
|---|---|---|---|
| 3,836,858 | 9/1974 | Kitano | 327/176 |
| 5,144,265 | 9/1992 | Petzold | 327/175 |
| 5,631,592 | 5/1997 | Schwarz et al. | 327/172 |

FOREIGN PATENT DOCUMENTS 5-288262  11/1993  Japan .

*Primary Examiner*—Tuan T. Lam
*Attorney, Agent, or Firm*—Nikaido Marmelstein Murray & Oram LLP

[57] ABSTRACT

Pulse signal generating device includes a duty cycle calculator for calculating a target duty cycle at predetermined intervals, a duty cycle comparator for making a comparison between the target duty cycle calculated by the duty cycle calculator and a current duty cycle of a pulse signal being currently output from the device, and a pulse signal adjuster. The duty cycle comparator determines whether the target duty cycle has presented a variation (increase or decrease) from the current duty cycle by over a predetermined value. Once the duty cycle comparator detects that a difference between the target duty cycle and the current duty cycle is more than the predetermined value, the pulse signal adjuster adjusts the pulse signal, using a pulse rise point immediately before the detection as an adjustment reference point, in such a manner that the pulse signal assumes a duty cycle corresponding to the target duty cycle.

7 Claims, 8 Drawing Sheets

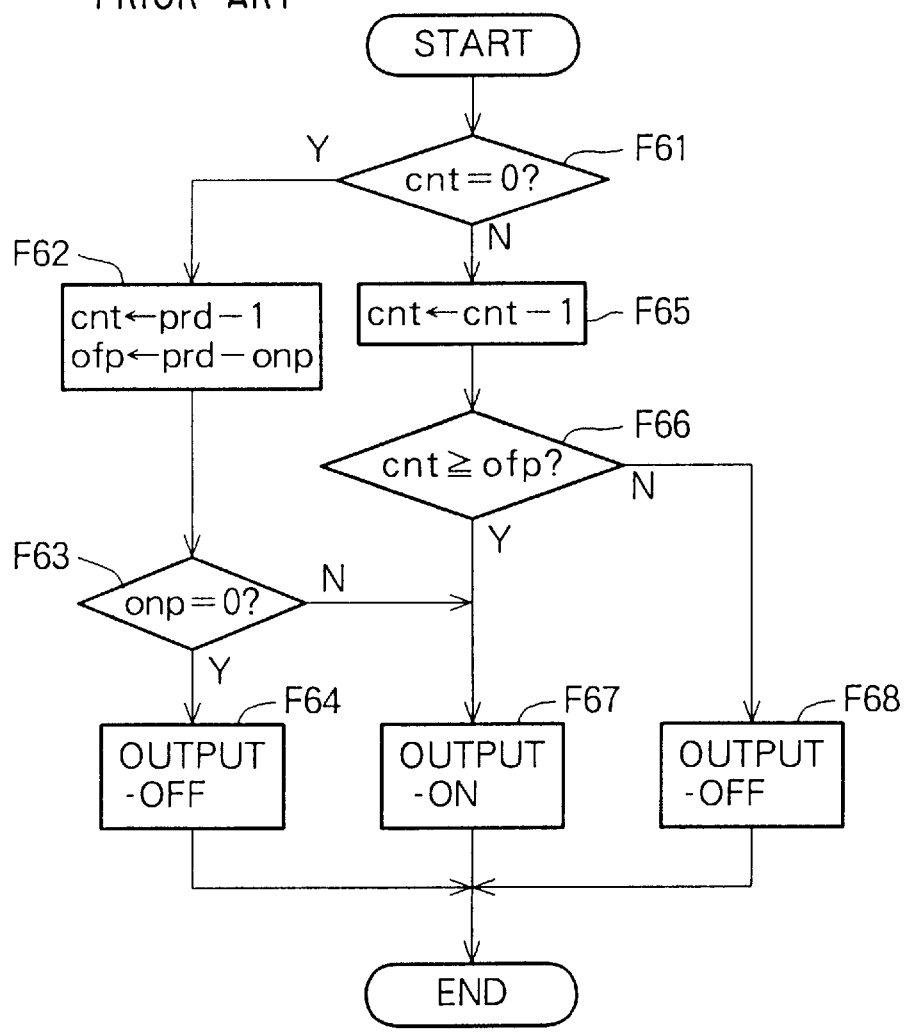

PULSE SIGNAL GENERATING DEVICE

BACKGROUND OF THE INVENTION

1. Field of the Invention

The present invention relates generally to pulse signal generating devices for generating pulse signals of variably controlled duty cycles, and more particularly to a pulse signal generating device which has increased responsiveness to sudden variations in a target duty cycle.

2. Description of the Related Art

In the field of lock-up clutches for automotive vehicles, it has been known to supply a train of pulse signals to a duty solenoid so as to control a clutch slip condition between the input and output shafts of the torque converter.

FIG. 7 is a block diagram outlining in block diagram the general arrangement of a conventionally-known pulse signal generating device 51 for supplying a train of pulse signals to a duty solenoid 57, which comprises a ROM 52, a RAM 56, interface (I/F) circuits 53 and 55, and a CPU 54. The CPU 54 outputs pulse signals via the interface circuit 55 by setting output-on and output-off states in an output port register (not shown) of the CPU 54.

The pulse signal generating device 51 of FIG. 7, which is designed to output pulse signals of variably controlled duty cycles, includes a duty cycle calculator (not shown) that calculates a target duty cycle at predetermined intervals so as to start outputting, at a rise point after the calculation, pulse signals of the calculated target duty cycle with a preset period. Exemplary operation of the pulse signal generating device 51 is illustrated in the flowcharts of FIGS. 8 and 9.

The subroutine of FIG. 8 is executed by the CPU 54 of FIG. 7 at predetermined intervals, e.g., every 20 ms so that the duty cycle calculator in the CPU 54 calculates a target duty cycle of each pulse signal at the predetermined intervals of 20 ms. Specifically, at step F51, the duty cycle calculator calculates a target duty cycle dtp of the pulse signal to be supplied to the duty cycle solenoid, on the basis of a detected vehicle velocity, throttle position, etc. At next step F52, the CPU 54 determines an on-time of the pulse signal on the basis of a product between preset period prd and the target duty cycle dtp.

The subroutine of FIG. 9 is executed at predetermined intervals, e.g., every 1 ms. The subroutine of FIG. 9 represents a control flow for outputting a pulse signal of the calculated target duty cycle with the preset period (e.g., 80 ms). In FIG. 9, upon power-on of the pulse signal generating device, a predetermined variable cnt, corresponding to a total time left before a next pulse rise point, is reset to "0".

At step F61, a determination is made as to whether the variable cnt is currently "0" or not. If the variable cnt is not "0", the subroutine proceeds to step F65, but if the variable cnt is "0", the subroutine goes to step F62. At step F62, a value obtained by subtracting a value "1" from the preset period prd (in ms) of the pulse signal is set as the variable cnt, and an on-time onp (in ms) is subtracted from the preset period prd so as to determine an off-time ofp (in ms). At next step F63, it is determined whether the on-time onp is currently "0" or not. If so, the subroutine goes to step F64 in order to set an output-off state in the output port register (not shown) of the CPU 54. If the on-time onp is not "0", the subroutine branches to step F67 in order to set an output-on state in the output port register.

At step F65, the variable ant is decremented by "1" Then, at step F66, a determination is made as to whether the variable cnt is equivalent to or greater in value than the off-time ofp. If so, the subroutine moves on to step F67, where an output-on state is set in the output port register. If, however, the variable ant is smaller than the off-time ofp, the subroutine branches to step F68, where an output-off state is set in the output port register.

In the known device, however, the subroutine of FIG. 8 calculates the target duty cycle dtp every 20 ms while the subroutine of FIG. 9 updates the off-time ofp every 80 ms as noted above, so that when the duty cycle dtp is varied from one value to another, the output of pulse signals of a waveform corresponding to the varied duty cycle dtp would be delayed by 80 ms maximum. Namely, the varied duty cycle is reflected only in pulse signals at and after the next pulse rise point, and thus it has been strongly demanded to improve responsiveness of the device to any variation in the duty cycle.

Japanese Patent Laid-pen Publication No. HEI-5-288262 discloses a pulse signal outputting apparatus, according to which, when a detection is made that the target duty cycle has increased from "0%" to another value, a pulse signal is caused to rise, using the time of the detection as a reference point. However, this reference fails to disclose a technique to allow a variation in the target duty cycle to be promptly reflected in a pulse signal when the duty cycle has increased or decreased from a value other than "0%" or decreased to a value other than "0%".

SUMMARY OF THE INVENTION

It is therefore an object of the present invention to provide a pulse signal generating device which includes a duty cycle calculator to calculate a target duty cycle at predetermined intervals so as to output a pulse signal of the calculated duty cycle and which, when the target duty cycle suddenly varies from one value to another, allows the target duty cycle variation to be promptly reflected in a pulse signal to be output from the device with increased responsiveness.

The pulse signal generating device according to the principle of the present invention comprises a duty cycle calculator for calculating a target duty cycle at predetermined intervals, a duty cycle comparator for making a comparison between the target duty cycle calculated by the duty cycle calculator and a current duty cycle of a pulse signal being currently output from the device, and a pulse signal adjuster. The duty cycle comparator determines whether the target duty cycle has presented a variation (increase or decrease) from the current duty cycle by over a predetermined value. Once the duty cycle comparator detects that a difference between the target duty cycle and the current duty cycle is more than the predetermined value, the pulse signal adjuster adjusts the pulse signal, using a pulse rise point immediately before the detection as an adjustment reference point, in such a manner that the pulse signal assumes a duty cycle corresponding to the target duty cycle.

The pulse signal adjuster includes an on-time extending section. When a detection is made, during an on-time of the pulse signal being currently output from the device, that the target duty cycle has presented an increase from the current duty cycle by over the predetermined value, the on-time extending section causes the pulse signal to fall at a predetermined point when time has passed from the pulse rise point immediately before the detection by an amount corresponding to a product between the preset period and the target duty cycle and then causes the pulse signal to rise at a predetermined point when time has passed from the pulse rise point immediately before the detection by an amount corresponding to the preset period.

The pulse signal adjuster also includes an off-time shortening section. When a detection is made, during an off-time of the pulse signal being currently output from the device, that the target duty cycle has presented an increase from the current duty cycle by over the predetermined value and when a ratio of, an on-time lasting up to time of the detection, to a time period from the pulse rise point immediately before the detection to the time of the detection is greater than the target duty cycle, the off-time shortening section causes the pulse signal to rise at a predetermined point when time has passed from the pulse rise point immediately before the detection by an amount corresponding to a product between the on-time lasting up to the time of the detection and a reciprocal of the target duty cycle.

The pulse signal adjuster also includes a rise quickening section. When a detection is made, during an off-time of the pulse signal being currently output from the device, that the target duty cycle has presented an increase from the current duty cycle by over the predetermined value and when a ratio of, an on-time lasting up to time of the detection, to a time period from the pulse rise point immediately before the detection to the time of the detection is equivalent to or smaller than the target duty cycle, the rise quickening section causes the pulse signal to rise before time corresponding to the preset period passes from the pulse rise point immediately before the detection.

The pulse signal adjuster also includes an on-time shortening section. When a detection is made, during an on-time of the pulse signal being currently output from the device, that the target duty cycle has presented a decrease from the current duty cycle by over the predetermined value and when a time length from the pulse rise point immediately before the detection to time of the detection is equivalent to or smaller than a product between the preset period and the target duty cycle, the on-time shortening section causes the pulse signal to fall at a predetermined point when time has passed from the pulse rise point immediately before the detection by an amount corresponding to the product between the preset period and the target duty cycle and then causes the pulse signal to rise at a predetermined point when time has passed from the pulse rise point immediately before the detection by an amount corresponding to the preset period.

The pulse signal adjuster also includes a delay promoting section. When a detection is made, during an on-time of the pulse signal being currently output from the device, that the target duty cycle has presented a decrease from the current duty cycle by over the predetermined value and when a time length from the pulse rise point immediately before the detection to the time of the detection is greater than a product between the preset period and the target duty cycle, the delay promoting section causes the pulse signal to fall before time passes from the pulse rise point immediately before the detection by an amount corresponding to the product between the preset period and the current duty cycle and then causes the pulse signal to rise at a predetermined point when time has passed from the pulse rise point immediately before the detection by an amount corresponding to a product between the on-time up to the time of the detection and a reciprocal of the target duty cycle.

The pulse signal adjuster also includes an off-time extending section. When a detection is made, during an on-time of the pulse signal being currently output from the device, that the target duty cycle has presented a decrease from the current duty cycle by over the predetermined value, the off-time extending section causes the pulse signal to rise at a predetermined point when time has passed from the pulse rise point immediately before the detection by an amount corresponding to a product between the on-time lasting up to time of the detection and a reciprocal of the target duty cycle.

BRIEF DESCRIPTION OF THE DRAWINGS

FIG. 9 is a flowchart illustrating a sequence of control operations with which the pulse signal generating device of FIG. 7 is controlled.

DETAILED DESCRIPTION OF THE PREFERRED EMBODIMENTS

Figure 1:
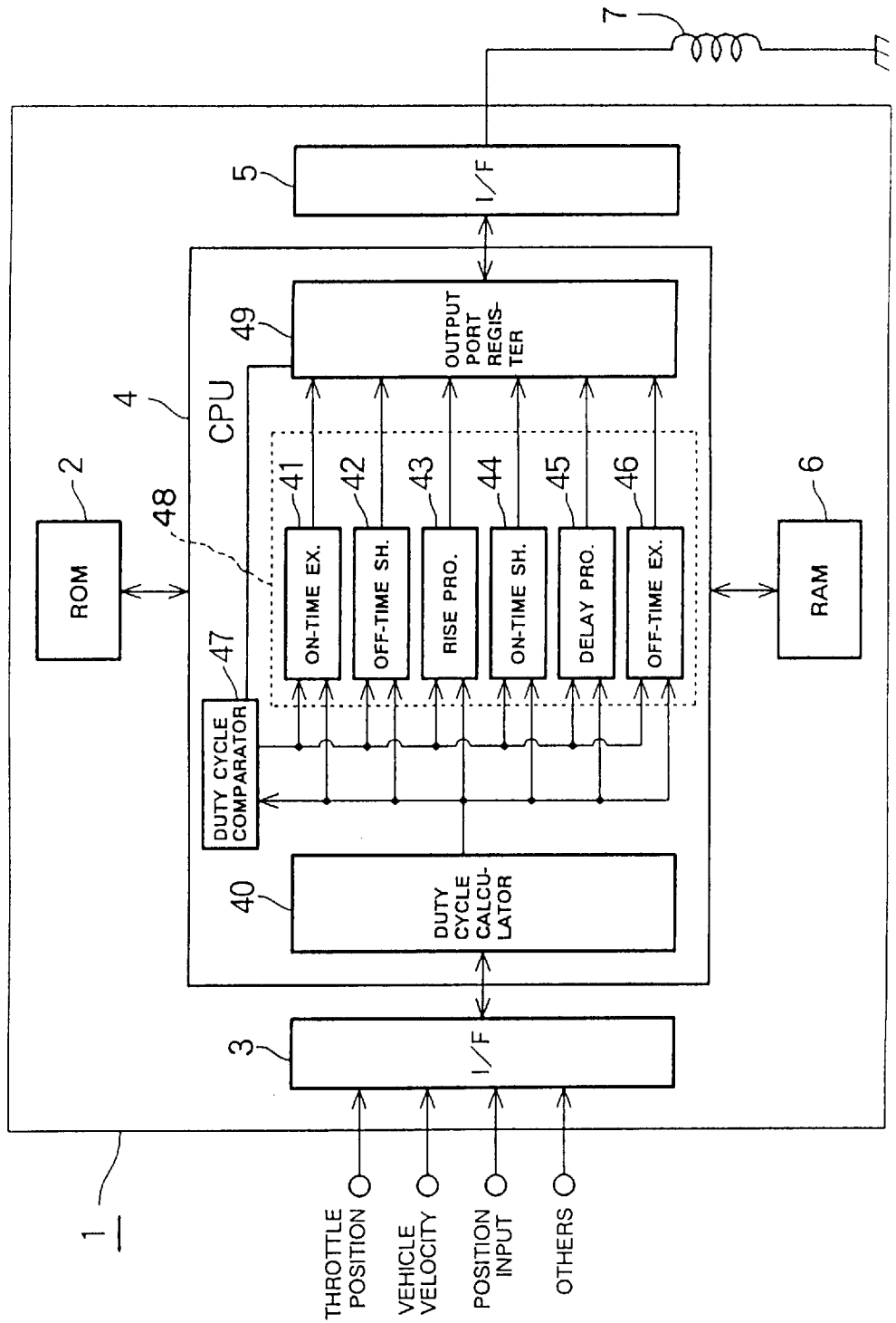
FIG. 1 is a block diagram illustrating a general structure of a pulse signal generating device, according to an embodiment of the present invention, which supplies a train of pulse signals to a duty cycle solenoid of an automotive vehicle.

FIG. 1 is a block diagram illustrating a general structure of a pulse signal generating device 1 according to an embodiment of the present invention, which comprises a ROM 2, a RAM 6, interface (I/F) circuits 3 and 5 and a CPU 4.

The CPU 4 outputs pulse signals via the interface circuit 5 by setting output-on and output-off states in an output port register 49 provided in the CPU 4.

The CPU 4 includes a duty cycle calculator 40 for calculating a target duty cycle or ratio at predetermined intervals, and a duty cycle comparator 47 for comparing the duty cycle calculated by the calculator 40 and a current duty cycle of a pulse signal being currently output from the device. The CPU 4 also includes a pulse signal adjuster 48 for, when the comparator 47 detects that a difference in the compared duty cycles exceeds a predetermined value, adjusting the pulse signal, using a pulse rise point immediately before the difference detection as an adjustment reference point, in such a manner that the pulse signal being currently output assumes a duty cycle corresponding to the target duty factor. The CPU 4 also includes an output port register 49.

The above-mentioned pulse signal adjuster 48 includes an on-time extending section 41, an off-time shortening section 42, a rise promoting section 43, an on-time shortening section 44, a delay promoting section 45 and an off-time extending section 46.

Figure 2:
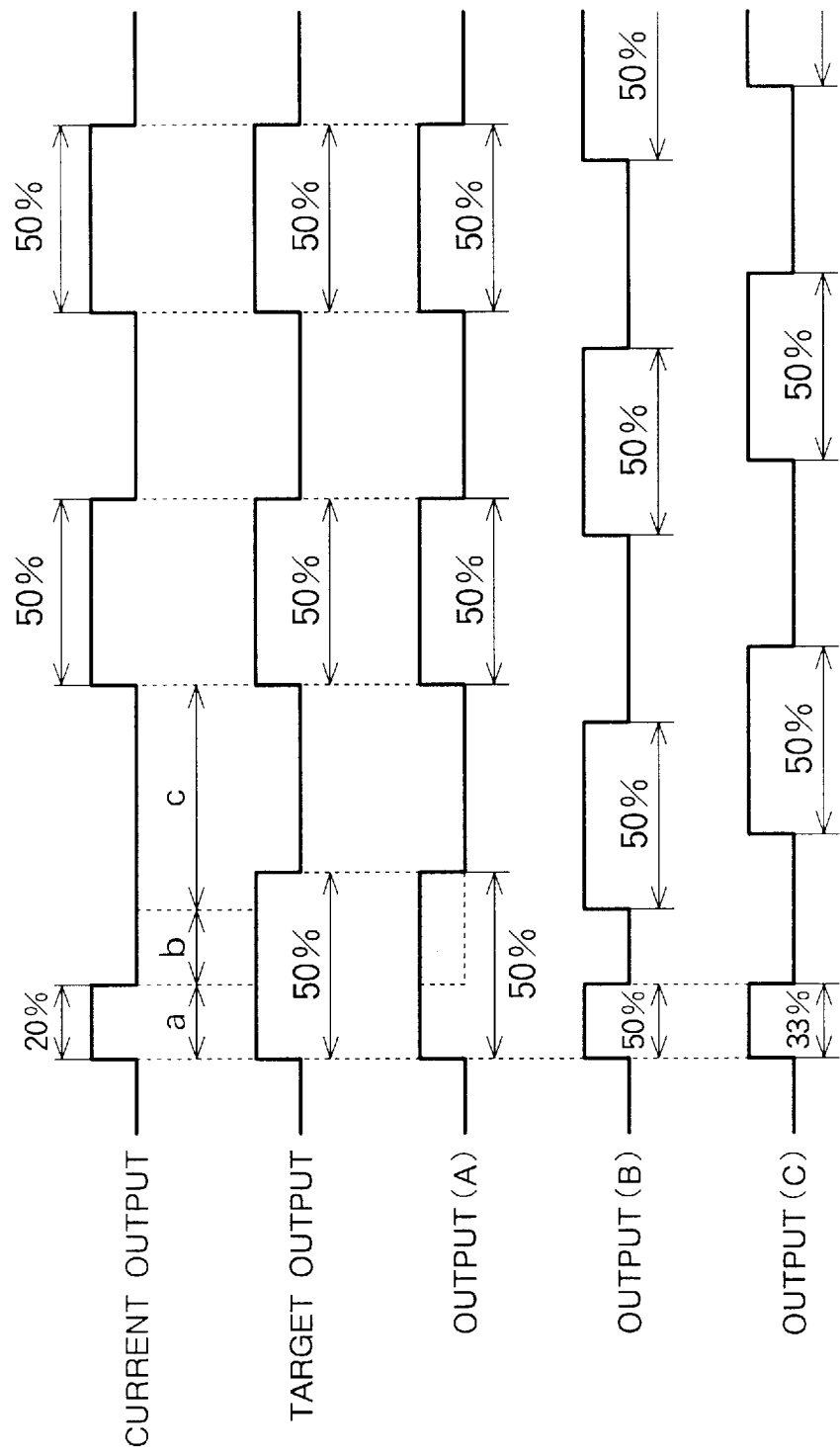
FIG. 2 is a time chart illustrating variations in pulse signals taking place when a target duty cycle has increased suddenly.

FIG. 2 shows an example in which a pulse signal having a duty cycle of 20% (equivalent to 0.2) is adjusted to have a duty cycle of 50% (equivalent to 0.5).

Namely, when a target duty cycle of increased value is output from the duty cycle calculator 40 during an on-time of a pulse signal (within period "a" in the figure), the on-time of the pulse signal is extended, as shown in "OUTPUT (A)" of FIG. 2, so as to yield pulse signals having the increased duty cycle. When a target duty cycle of increased value is output from the duty cycle calculator 40 during an off-time of a pulse signal (within period "b" in the figure), the off-time of the pulse signal is shortened, as shown in "OUTPUT (B)" of FIG. 2, so as to yield pulse signals having the increased duty cycle. Further, when a target duty cycle of increased value is output from the duty cycle calculator 40 during an off-time of a pulse signal (within period "c" in the figure) and if the increased duty cycle is too small even after the off-time has been shortened, the off-time of the pulse signal is shortened, shown in "OUTPUT (C)" of FIG. 2, so as to yield pulse signals having a duty cycle approximate to the increased value.

Figure 3:
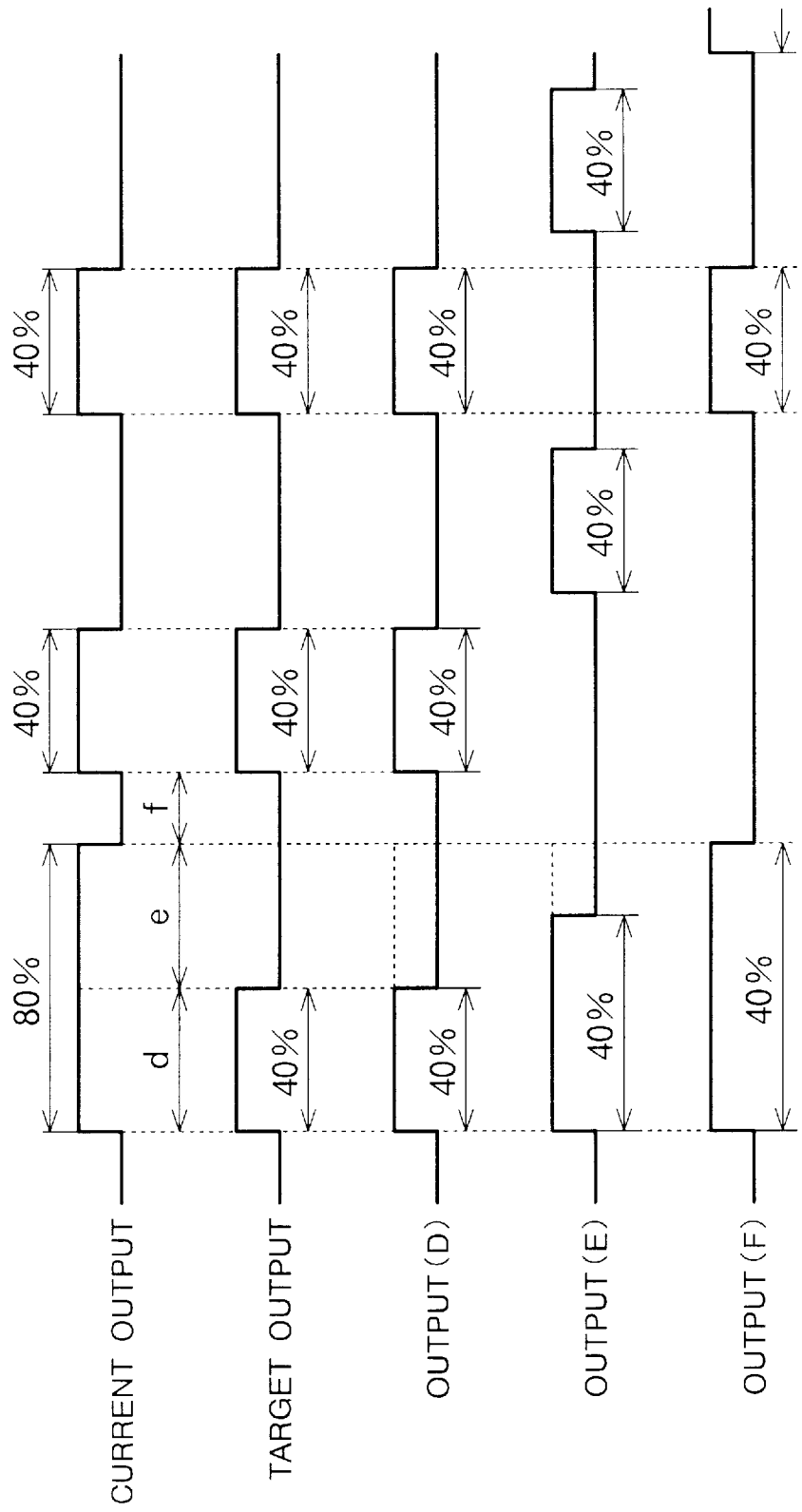
FIG. 3 is a time chart illustrating variations in pulse signals taking place when the target duty cycle has decreased suddenly.

FIG. 3 shows another example in which a pulse signal having a duty cycle of 80% (equivalent to 0.8) is adjusted to have a pulse signal having a duty cycle of 40% (equivalent to 0.4).

Namely, when a duty cycle of decreased value is output from the duty cycle calculator 40 during an on-time of a pulse signal (within period "d" in the figure), the on-time of the pulse signal is shortened, as shown in "OUTPUT (D)" of FIG. 3, so as to yield pulse signals having the decreased duty cycle. When a duty cycle of decreased value is output from the duty cycle calculator 40 during an on-time of a pulse signal (within period "e" in the figure) and if the decreased duty cycle is too great even after the on-time has been shortened, the on-time of the pulse signal is shortened and also the off-time of the pulse signal is extended, as shown in "OUTPUT (E)" of FIG. 3, so as to yield pulse signals having the decreased duty cycle. Further, when a duty cycle of decreased value is output from the duty cycle calculator 40 during an off-time of a pulse signal (within period "f" in the figure), the off-time of the pulse signal is extended, as shown in "OUTPUT (F)" of FIG. 3, so as to yield pulse signals having the decreased duty cycle.

Figure 4:
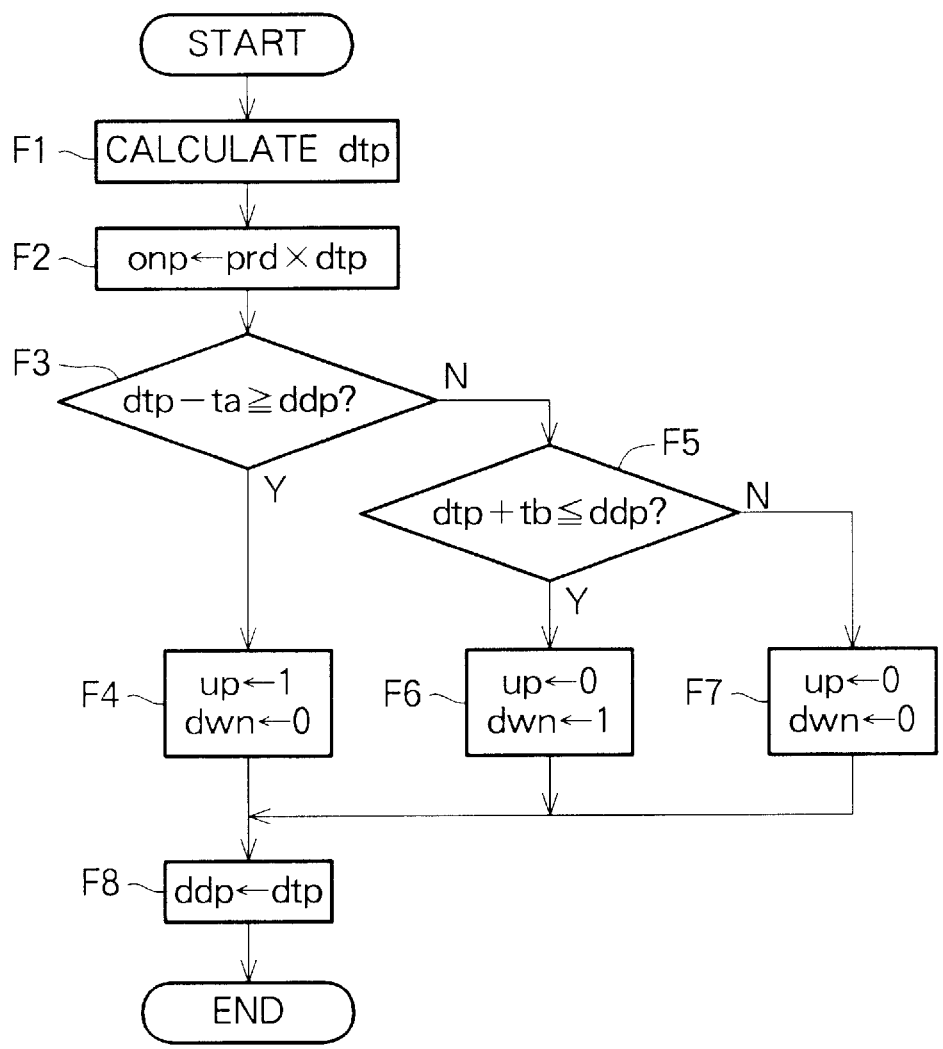
FIG. 4 is a flowchart illustrating an exemplary sequence of operations for controlling a duty cycle calculator and duty cycle comparator provided in the pulse signal generating device.
Figure 5:
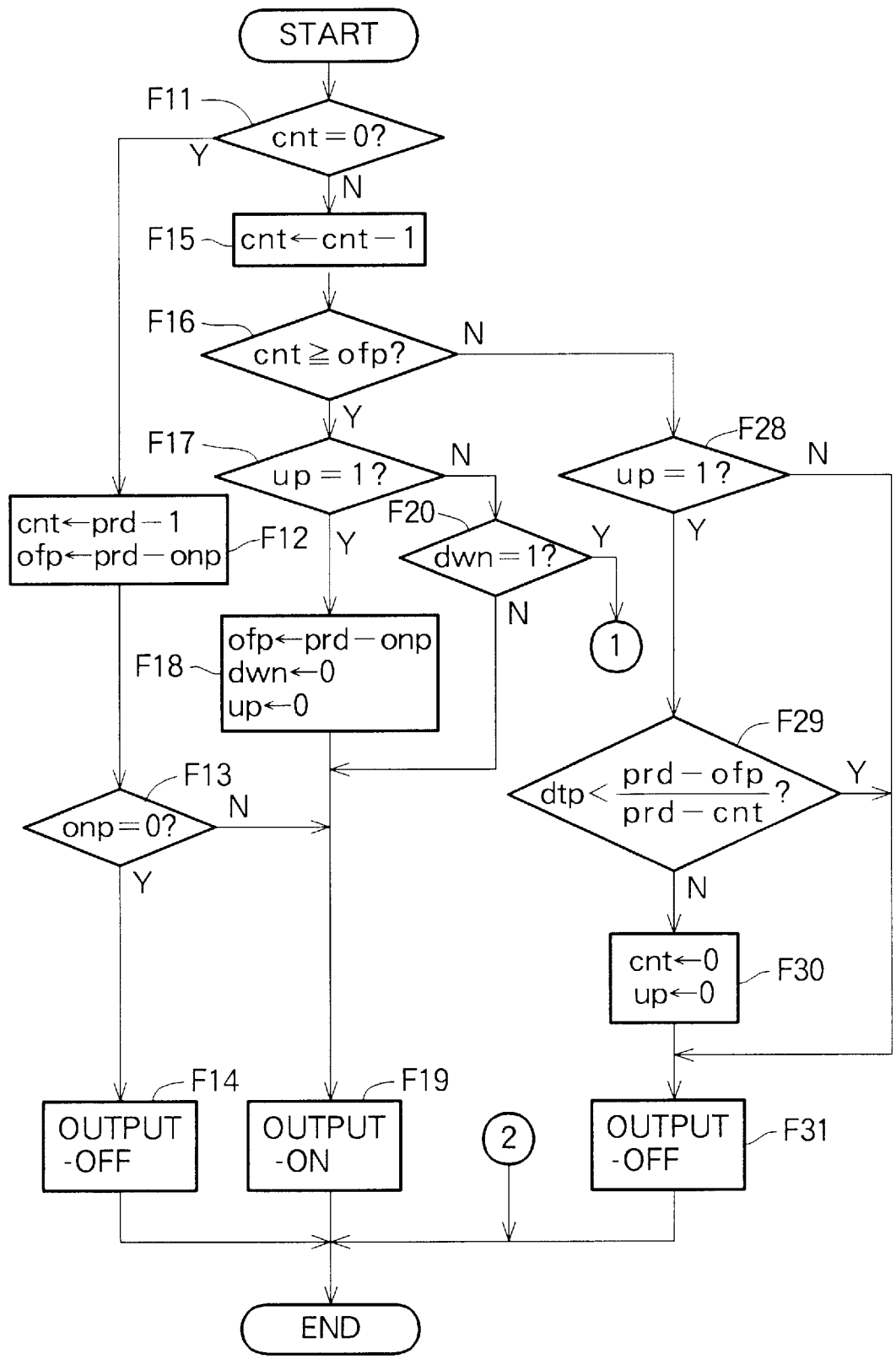
FIG. 5 is a flowchart illustrating part of an exemplary sequence of control operations for controlling a pulse signal adjuster provided in the pulse signal generating device.
Figure 6:
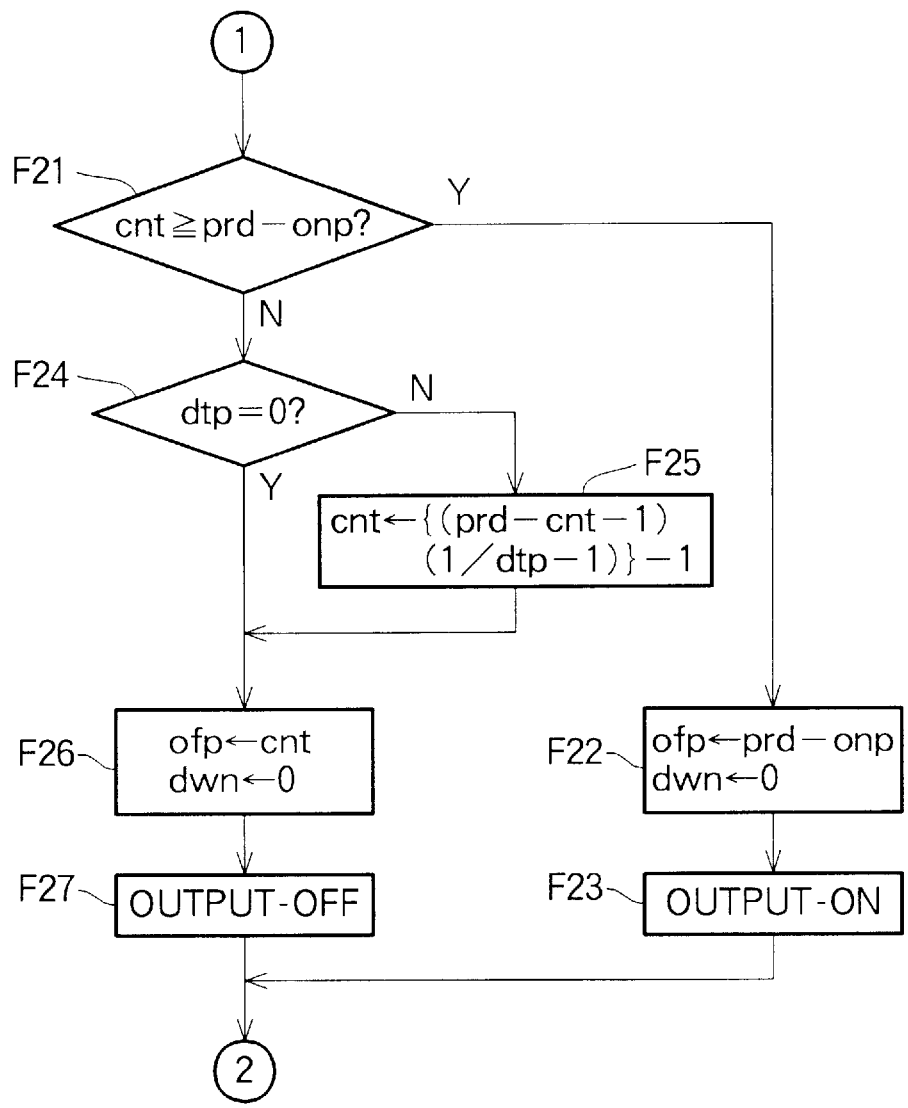
FIG. 6 is a flowchart illustrating the remaining part of the sequence of control operations for controlling the pulse signal adjuster.
Figure 7:
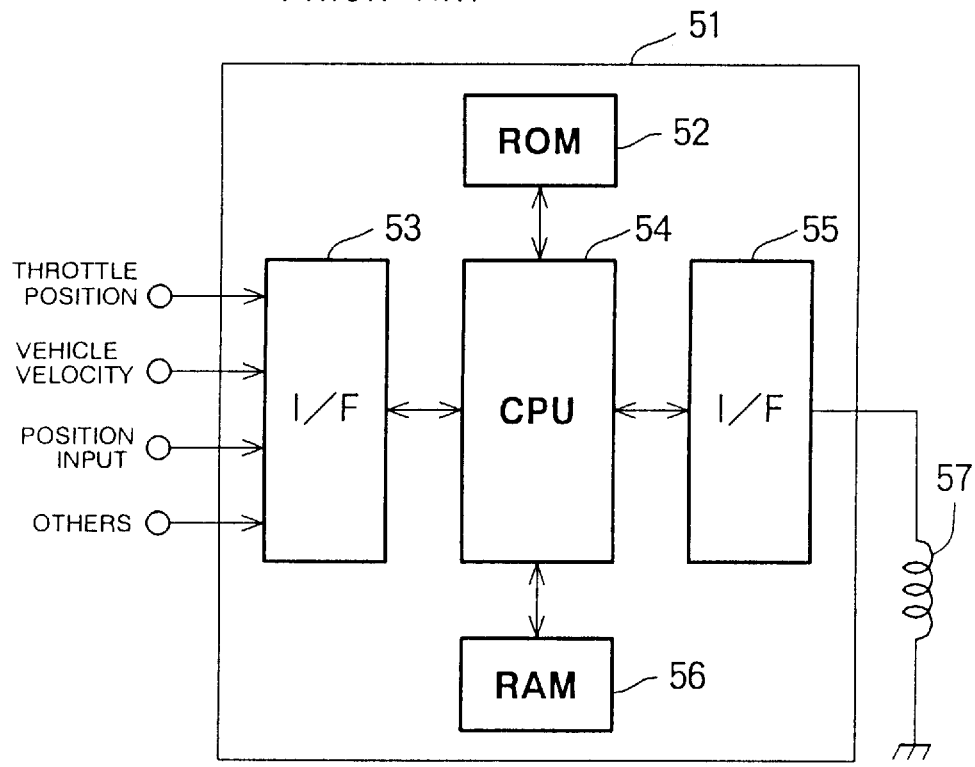
FIG. 7 is a block diagram outlining a structure of a conventionally-known pulse signal generating device which supplies a train of pulse signals to a duty cycle solenoid.
Figure 8:
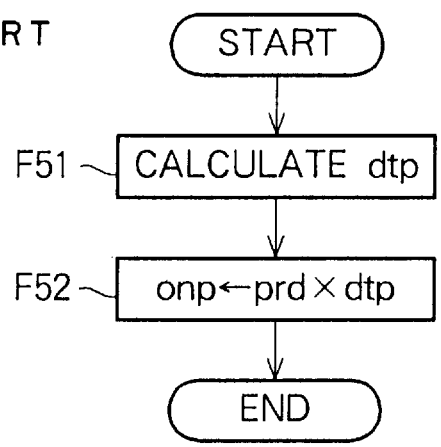
FIG. 8 is a flowchart illustrating a sequence of control operations with which a duty cycle is calculated at predetermined intervals in the pulse signal generating device of FIG. 7.

FIGS. 4 and 5 and 6 are flowcharts of subroutines for controlling the generation of pulse signals (OUTPUT (A)–OUTPUT (E)) described earlier in relation to FIGS. 2 and 3.

FIG. 4 illustrates operational steps for controlling the duty cycle calculator 40 of FIG. 1 which calculates a target duty cycle at predetermined intervals (e.g., every 20 ms), as well as steps for controlling the duty cycle comparator 47 which makes a comparison between the duty cycle calculated by the duty cycle calculator 40 and a duty cycle of a pulse signal being currently output from the device (hereinafter referred to as a "current duty cycle"). This subroutine is executed by the CPU 4 at predetermined intervals (e.g., every 20 ms).

At first step F1 of FIG. 4, the duty cycle calculator 40 of the CPU 4 of FIG. 1 calculates a target duty cycle dtp of a pulse signal to be supplied to the duty cycle solenoid, on the basis of a current velocity and throttle position, etc. At next step F2, an on-time of the pulse signal is determined by multiplying a preset period prd by the target duty cycle dtp.

Then, a determination is made at step F3 as to whether the calculated target duty cycle dtp presents an increase from the current duty cycle (i.e., last-calculated target duty cycle) by over a predetermined value (predetermined threshold value) ta—here, the predetermined threshold value ta is assumed to be 10% (equivalent to 0.1). If the target duty cycle dtp does not present the predetermined increase from the current duty cycle, then the subroutine goes to step F5, but if the target duty cycle dtp presents the predetermined increase, the subroutine moves on to step F4. At step F4, an "up" flag is set to a value "1" while a "down" flag is set to a value "0" in order to indicate that there is a sudden increase in the target duty cycle. After this, the subroutine proceeds to step F8.

At step F5, it is determined whether the target duty cycle dtp presents a decrease from the current duty cycle by over a predetermined value (predetermined threshold value) tb, —here, the predetermined threshold value tb is assumed to be 15% (equivalent to 0.15). If the target duty cycle dtp does not present the predetermined decrease, the subroutine goes to step F7, but if the target duty cycle dtp presents the predetermined decrease, the subroutine moves on to step F6.

At step F6, the "up" flag is set to "0" while the "down" flag is set to "1" in order to indicate that there is a sudden decrease in the target duty cycle, and after this, the subroutine proceeds to step F8. At step F7, the "up" flag and "down flag" are both set to "0" in order to indicate that there is no sudden increase or decrease in the target duty cycle, and after this, the subroutine proceeds to step F8. At step F8, the current duty cycle or last-calculated duty cycle dtp is replaced by the target duty cycle dtp.

According to the present invention, the threshold values ta and tb may be chosen to be a same value, rather than being different values as mentioned above.

FIG. 5 illustrates part of a subroutine for controlling the pulse signal adjuster 48, and FIG. 6 illustrating the remaining part of the subroutine. The subroutine illustrated in FIGS. 5 and 6 is executed at predetermined intervals, e.g., every 1 ms.

Upon power-on of the pulse signal generating device, a predetermined variable cnt, corresponding to a time left before a next pulse rise point, is initialized to a value "0".

At step F11 of FIG. 5, a determination is made as to whether the variable cnt is currently "0" or not. If the variable cnt is not "0", the subroutine proceeds to step F15, but if the variable cnt is "0", the subroutine branches to step F12. At step F12, a value obtained by subtracting "1" from the preset period prd is set as the variable cnt, and an on-time onp is subtracted from the preset period prd so as to determine an off-time ofp.

At next step F13, it is determined whether the on-time onp is "0" or not. If so, the subroutine goes to step F14 in order to set an output-off state in the output port register 49 of FIG. 1. If the on-time onp is not "0", the subroutine branches to step F19 in order to set an output-on state in the output port register 49.

At step F15, the variable cnt is decremented by "1". Then, at step F16, a determination is made as to whether the variable cnt is equivalent to or greater in value than the off-time ofp. If so, the subroutine moves on to step F17, but if the variable cnt is smaller in value than the off-time ofp not, the subroutine branches to step F28.

At step F17, a determination is made as to whether the "up" flag is currently at "1". If not, the subroutine goes to step F20. If the "up" flag is currently at "1", this means that the target duty cycle dtp has presented a sudden increase during the on-time, and thus the subroutine moves on to step F18. At step F18, the off-time ofp is updated to take a value that is obtained by subtracting the suddenly increased duty cycle value dtp from the preset period prd, and the "up" flag and "down" flag are both set to "0". After this, the subroutine moves on to step F19 to maintain the output-on state.

At step F20, a further determination is made as to whether the "down" flag is currently at "1". If not, the subroutine goes to step F19 in order to maintain the output-on state. If the "down" flag is currently at "1", this means that the target duty cycle dtp has presented a sudden decrease during the on-time, and thus the subroutine goes to step F21 shown in FIG. 6.

In FIG. 6, a comparison is made at step F21 between the above-mentioned value obtained by subtracting the suddenly decreased duty cycle dtp from the preset period prd (i.e., subtraction result) and the variable cnt. If the variable cnt is smaller than the subtraction result, the subroutine goes to step F24, while if the variable cnt is equivalent to or greater than the subtraction result, then the subroutine goes to step F22.

At step F22, the off-time ofp is updated to take the above-mentioned value obtained by subtracting the suddenly decreased duty cycle dtp from the preset period prd, and the "down" flag is set to "0". After this, the subroutine moves on to step F23 to maintain the output-on state. At step F24, a determination is made as to whether the target duty cycle dtp is "0" or not, in order to prevent division by the value "0". If the target duty cycle dtp is "0", the subroutine goes to step F26; otherwise, the subroutine goes to step F25.

At step F25, the variable cnt is updated. Specifically, the on-time lasting up to the current time is divided by the suddenly decreased target duty cycle dtp so as to calculate one period of a waveform having the target duty cycle, and a value obtained by subtracting the on-time lasting up to the current time from the calculated one period is determined as an updated value of the variable cnt. As a specific example, considering a value obtained by subtracting the current cnt and "1" from the preset period prd to be a current measurement of the on-time, the on-time is divided by the suddenly decreased target duty cycle dtp to thereby provide, in an integral number, one period of the waveform having the target duty cycle. Then, the current on-time and "1" are subtracted from the calculated one period, and the subtraction result is determined as an updated value of the variable cnt.

At step F26, the updated value of the variable cnt is set as the off-time ofp, and the "down" flag is set to "0". Then, the subroutine goes to step F27 to switch the generating device to an output-off state.

At step F28 of FIG. 5, it is determined whether the "up" flag is currently at "1" or not. If not, the subroutine goes to step F31 in order to set an output-off state in the output port register 49 of FIG. 1. If the "up" flag is currently at "1" as determined at step F28, this means that the target duty cycle dtp has presented a sudden increase during an off-time, and thus the subroutine moves on to step F29.

At step F29, a comparison is made between the suddenly increased target duty cycle dtp and a value obtained by dividing the on-time lasting up to the time of the detection by an elapsed time from a pulse rise point immediately before the time of the detection (e.g., (prd−ofp)/(prd−cnt)). If the division result ((prd−ofp)/(prd−cnt)) is greater in value than the target duty cycle dtp, then the subroutine goes to step F31. If, however, the division result ((prd−ofp)/(prd−cnt)) is equivalent to or smaller in value than the target duty cycle dtp, then the subroutine goes to step E30, where the variable cnt is reset to "0" and the "up" flag is also reset to "0". At step F31, an output-off state is set in the output port register 49 of FIG. 1.

The on-time extending section 41 of the pulse signal adjuster 48 shown in FIG. 1 has the following function. When it is detected, during an on-time of a pulse signal being currently output from the device, that the target duty cycle has increased by over a predetermined value, the on-time extending section 41 causes the pulse signal to fall at a predetermined point when time has passed from the pulse rise point immediately before the time of the detection by an amount corresponding to a product between the preset period and the target duty cycle and then causes the pulse signal to rise at a predetermined point when time has passed from the pulse rise point immediately before the time of the detection by an amount corresponding to the preset period. This on-time extending section 41 operates on the basis of the following steps of FIG. 5.

Namely, in FIG. 5, steps F16 and F17 effect the operation of detecting, during the on-time of the pulse signal being currently output from the device, that the target duty cycle has increased by over the predetermined value, and upon such a detection, the subroutine proceeds to step F18. The operation of causing the pulse signal to fall at a predetermined point when time has passed from the pulse rise point immediately before the detection by an amount corresponding to a product between the preset period and the target duty cycle is effected by step F18 shortening the off-time ofp and then step F31 setting an off-set state by way of steps F15, F16 and F28. Further, the operation of causing the pulse signal to rise at a predetermined point when time has passed from the pulse rise point immediately before the detection by an amount corresponding to the preset period, is effected by step F15 incrementing the variable cnt by only "1" and then step F19 setting an output-on state by way of steps F11, F12 and F13.

Further, the off-time shortening section 42 of the pulse signal adjuster 48 shown in FIG. 1 has the following function. When it is detected, during an off-time of a pulse signal being currently output from the device, that the target duty cycle has increased by over a predetermined value, and if a ratio of the on-time lasting up to the time of the detection to a time period from the pulse rise point immediately before the detection to the time of the detection is greater than the target duty cycle, the off-time shortening section 42 causes the pulse signal to rise at a predetermined point when time has passed from the pulse rise point immediately before the detection by an amount corresponding to a product between the on-time lasting up to the time of the detection and the reciprocal of the target duty cycle. This off-time shortening section 42 operates on the basis of the following steps of FIG. 5.

Namely, in FIG. 5, steps F16 and F28 effect the operation of detecting, during the off-time of the pulse signal being currently output from the device, that the target duty cycle has increased by over the predetermined value. The operation of detecting that the ratio of the on-time lasting up to the time of the detection to the time from the pulse rise point immediately before the detection to the time of the detection is greater than the target duty cycle, is effected by step F29, and upon such a detection, the subroutine goes to step F31 to set an output-off state. The operation of causing the pulse signal to rise at a predetermined point when time has passed from the pulse rise point immediately before the detection by an amount corresponding to a product between the on-time lasting up to the time of the detection and the reciprocal of the target duty is effected by step F30 resetting the variable cnt to "0" and then step F19 setting an on-set state by way of steps F11, F12 and F13.

Further, the rise quickening section 43 of the pulse signal adjuster 48 shown in FIG. 1 has the following function.

When it is detected, during an off-time of a pulse signal being currently output from the device, that the target duty cycle has increased by over a predetermined value, and if a ratio of the on-time lasting up to the time of the detection to a time period from the pulse rise point immediately before the detection to the time of the detection is equivalent to or smaller than the target duty cycle, the rise quickening section 43 causes the pulse signal to rise before time corresponding to the preset period passes from the pulse rise point immediately before the detection. This rise quickening section 43 operates on the basis of the following steps of FIG. 5.

Namely, in FIG. 5, steps F16 and F28 effect the operation of detecting, during the off-time of the pulse signal being currently output from the device, that the target duty cycle has increased by over the predetermined value. The operation of detecting that the ratio of the on-time lasting up to the time of the detection to the time period from the pulse rise point immediately before the detection to the time of the detection is equivalent to or smaller than the target duty cycle is effected by step F29, and upon such a detection, the subroutine goes to step F30. The operation of causing the pulse signal to rise before time corresponding to the preset period passes from the pulse rise point immediately before the detection is effected by step F30 resetting the variable cnt to "0" and then step F19 setting an on-set state by way of steps F11, F12 and F13.

Further, the on-time shortening section 44 of the pulse signal adjuster 48 shown in FIG. 1 has the following function. When it is detected, during an on-time of a pulse signal being currently output from the device, that the target duty cycle has decreased by over a predetermined value, and if a time length from the pulse rise point immediately before the detection to the time of the detection is equivalent to or smaller than a product between the preset period and the target duty cycle, the on-time shortening section 44 causes the pulse signal to fall at a predetermined point when time has passed from the pulse rise point immediately before the detection by an amount corresponding to the product between the preset period and the target duty cycle and then causes the pulse signal to rise at a predetermined point when time has passed from the pulse rise point immediately before the detection by an amount corresponding to the preset period. This on-time shortening section 44 operates on the basis of the following steps of FIGS. 5 and 6.

Namely, in FIGS. 5 and 6, steps F16, F17 and F20 effect the operation of detecting, during the off-time of the pulse signal being currently output from the device, that the target duty cycle has decreased by over the predetermined value. Step F21 effects the operation of detecting the time length from the pulse rise point immediately before the detection to the time of the detection is equivalent to or smaller than the product between the preset period and the target duty cycle. The operation of causing the pulse signal to fall at a predetermined point when time has passed from the pulse rise point immediately before the detection by an amount corresponding to a product between the preset period and the target duty cycle is effected by step F22 resetting the off-time ofp to "0" and then steps F15, F16, F28 and F31 being taken by way of step F23. The operation of causing the pulse signal to rise at a predetermined point when time has passed from the pulse rise point immediately before the detection by an amount corresponding to the preset period is effected by step F15 decrementing the variable cnt by "1" and then step F19 setting an output-on state by way of steps 11, F12 and F13.

Further, the delay promoting section 45 of the pulse signal adjuster 48 shown in FIG. 1 has the following function.

When it is detected, during an on-time of a pulse signal being currently output from the device, that the target duty cycle has decreased by over a predetermined value, and if a time length from the pulse rise point immediately before the detection to the time of the detection is greater than a product between the preset period and the target duty cycle, the delay promoting section 45 causes the pulse signal to fall before time passes from the pulse rise point immediately before the detection by an amount corresponding to the product between the preset period and the current duty cycle and then causes a pulse signal to rise at a predetermined point when time has passed from the pulse rise point immediately before the detection by an amount corresponding to a product between the on-time and a reciprocal of the target duty cycle. This delay promoting section 45 operates on the basis of the following steps of FIGS. 5 and 6.

Namely, in FIGS. 5 and 6, steps F16, F17 and F20 effect the operation of detecting, during an off-time of the pulse signal being currently output from the device, that the target duty cycle has decreased by over the predetermined value. Step F21 detects that the time length from the pulse rise point immediately before the detection to the time of the detection is greater than the product between the preset period and the target duty cycle, upon such a detection, the subroutine goes to step F24. The operation of causing the pulse signal to fall before time passes from the pulse rise point immediately before the detection by an amount corresponding to the product between the preset period and the current duty cycle is effected by step F26 setting the value of the variable cnt as the off-time ofp and then steps F15, F16, F28 and F31 being taken by way of step F27. The operation of causing a pulse signal to rise at the predetermined point when time has passed from the pulse rise point immediately before the detection by an amount corresponding to the product between the on-time and the reciprocal of the target duty cycle is effected by step F25 updating the variable cnt and step F19 setting an output-on state by way of steps F15, F16, F28 and F31 and steps F11, F12 and F13.

Furthermore, the off-time extending section 46 of the pulse signal adjuster 48 shown in FIG. 1 has the following function. When it is detected, during an off-time of a pulse signal being currently output from the device, that the target duty cycle has decreased by over a predetermined value, the off-time extending section 46 causes the pulse signal to rise at a predetermined point when time has passed from the pulse rise point immediately before the detection by an amount corresponding to a product between the on-time lasting up to the detection and a reciprocal of the target duty cycle. This on-time extending section 41 operates on the basis of the following steps of FIGS. 5 and 6.

Namely, steps F16, F17 and F20 effect the operation of detecting, during an off-time of the pulse signal being currently output from the device, that the target duty cycle has decreased by over the predetermined value. The operation of causing the pulse signal to rise at a predetermined point when time has passed from the pulse rise point immediately before the detection by an amount corresponding to the product between the on-time lasting up to the detection and the reciprocal of the target duty cycle is effected by step F25 updating the variable cnt and step F19 setting an output-on state by way of steps F15, F16, F28 and F31 and steps F11, F12 and F13.

Following the above-mentioned control operations, the pulse signal generating device 1 outputs the pulse signal of the target duty cycle dtp with a preset period prd (e.g., 80 ms) from a first pulse rise point after the time of the comparison or detection.

By executing the subroutine of FIGS. 5 and 6 for controlling the signal adjuster 48 at predetermined intervals (e.g., 1 ms) shorter than the calculating interval (e.g., 20 ms) of the calculator 40 of FIG. 1, it is possible to detect any variation in the calculated target duty cycle and the detected variation can be promptly reflected in the pulse signal.

As a modification of the pulse signal generating device 1, the duty cycle comparator 47 and pulse signal adjuster 48 may be combined into a single component, or the duty cycle comparator 47 may be arranged to include the pulse signal adjuster 48. As another modification, the off-time shortening section 42 may include a limiter which limits an off-time to not be shorter than a predetermined length in "OUTPUT (B)" of FIG. 2. Further, the delay promoting section 45 and/or off-time extending section 46 may include a limiter which limits an on-time to not be greater than a predetermined length in "OUTPUT (E)" and "OUTPUT (F)" of FIG. 2.

The above-described embodiments of the invention afford various benefits as follows:

By the provision of the duty cycle calculator, duty cycle comparator and pulse signal adjuster, any variation in target duty cycle can be reflected promptly in a pulse signal with increased responsiveness, and hence a pulse signal of any target duty cycle can be created in real time.

With the on-time extending section provided in the pulse signal adjuster, an on-time of a pulse signal can be reliably extended when a target duty cycle increased by over a predetermined value is output during the on-time of the signal, and hence a pulse signal of any target duty cycle can be created in real time.

With the off-time shortening section provided in the pulse signal adjuster, an off-time of a pulse signal can be reliably shortened when a target duty cycle increased by over a predetermined value is output during the off-time of the signal, and a pulse signal of any target duty cycle can be created in real time.

With the rise promoting section provided in the pulse signal adjuster, an off-time of a pulse signal can be reliably shortened when a target duty cycle increased by over a predetermined value is output during the off-time of the signal, and hence a pulse signal of any target duty cycle can be created in real time.

With the on-time shortening section provided in the pulse signal adjuster, an on-time of a pulse signal can be reliably shortened when a target duty cycle decreased by over a predetermined value is output during the on-time of the signal, and hence a pulse signal of any target duty cycle can be created in real time.

With the delay promoting section provided in the pulse signal adjuster, an on-time of a pulse signal can be reliably shortened and an off-time following the on-time can be extended when a target duty cycle decreased by over a predetermined value is output during the on-time of the signal, and hence a pulse signal of any target duty cycle can be created in real time.

With the off-time extending section provided in the pulse signal adjuster, an off-time of a pulse signal can be reliably extended when a target duty cycle decreased by over a predetermined value is output during the off-time of the signal, and hence a pulse signal of any target duty cycle can be created in real time.

Further, by adjusting the above-mentioned predetermined values (threshold values), the responsiveness of the pulse signal generating device can be appropriately fitted for respective operational characteristics of various equipment to which the device is applied.

Because each calculated target duty cycle can be reflected in real time, the pulse signal generating device of the present invention can significantly improve its responsiveness to variations in target duty cycle in generating pulse signals having different duty cycles. In particular, the present invention is very useful for increased fuel efficiency and operability when it is applied to lockup clutches of automotive vehicles to control slip conditions between the input and output shafts of the torque converter by supplying pulse signals to the duty solenoid.

What is claimed is:

1. A pulse signal generating device comprising:

a duty cycle calculator for calculating a target duty cycle at predetermined uniform intervals;

a duty cycle comparator for making a comparison, at said predetermined uniform intervals, between the target duty cycle calculated by said duty cycle calculator and a current duty cycle of a pulse signal being currently output from said device, said device therein outputting the pulse signal with the target duty cycle for a preset period from a pulse rise point following the comparison, said predetermined uniform intervals being shorter than the preset period of the pulse signal; and a pulse signal adjuster for, when a detection is made via said duty cycle comparator that a difference between the target duty cycle and current duty cycle is more than a predetermined value, adjusting the pulse signal being currently output from said device, using said pulse rise point immediately before the detection as an adjustment reference point, in such a manner that said pulse signal being currently output from said device assumes a duty cycle corresponding to the target duty cycle.

2. A pulse signal generating device as claimed in claim 1 wherein said pulse signal adjuster includes an on-time extending section for, when a detection is made, during an on-time of the pulse signal being currently output from said device, that the target duty cycle has presented an increase from the current duty cycle by over the predetermined value, causing the pulse signal to fall at a first predetermined point when time has passed from the pulse rise point immediately before the detection by an amount corresponding to a product between the preset period and the target duty cycle and then causing the pulse signal to rise at a second predetermined point when time has passed from the pulse rise point immediately before the detection by an amount corresponding to the preset period.

3. A pulse signal generating device as claimed in claim 1 wherein said pulse signal adjuster includes an off-time shortening section for, when a detection is made, during an off-time of the pulse signal being currently output from said device, that the target duty cycle has presented an increase from the current duty cycle by over the predetermined value and when a ratio of, an on-time lasting up to time of the detection, to a time period from the pulse rise point immediately before the detection to the time of the detection is greater than the target duty cycle, causing the pulse signal to rise at a predetermined point when time has passed from the pulse rise point immediately before the detection by an amount corresponding to a product between the on-time lasting up to the time of the detection and a reciprocal of the target duty cycle.

4. A pulse signal generating device as claimed in claim 1 wherein said pulse signal adjuster includes a rise quickening section for, when a detection is made, during an off-time of the pulse signal being currently output from said device, that the target duty cycle has presented an increase from the current duty cycle by over the predetermined value and when a ratio of, an on-time lasting up to time of the detection, to a time period from the pulse rise point immediately before the detection to the time of the detection is equivalent to or smaller than the target duty cycle, causing the pulse signal to rise before time corresponding to the preset period passes from the pulse rise point immediately before the detection.

5. A pulse signal generating device as claimed in claim 1 wherein said pulse signal adjuster includes an on-time shortening section for, when a detection is made, during an on-time of the pulse signal being currently output from said device, that the target duty cycle has presented a decrease from the current duty cycle by over the predetermined value and when a time length from the pulse rise point immediately before the detection to time of the detection is equivalent to or smaller than a product between the preset period and the target duty cycle, causing the pulse signal to fall at a first predetermined point when time has passed from the pulse rise point immediately before the detection by an amount corresponding to the product between the preset period and the target duty cycle and then causing the pulse signal to rise at a second predetermined point when time has passed from the pulse rise point immediately before the detection by an amount corresponding to the preset period.

6. A pulse signal generating device as claimed in claim 1 wherein said pulse signal adjuster includes a delay promoting section for, when a detection is made, during an on-time of the pulse signal being currently output from said device, that the target duty cycle has presented a decrease from the current duty cycle by over the predetermined value and when a time length from the pulse rise point immediately before the detection to the time of the detection is greater than a product between the preset period and the target duty cycle, causing the pulse signal to fall before time passes from the pulse rise point immediately before the detection by an amount corresponding to the product between the preset period and the current duty cycle and then causing the pulse signal to rise at a predetermined point when time has passed from the pulse rise point immediately before the detection by an amount corresponding to a product between the on-time up to the time of the detection and a reciprocal of the target duty cycle.

7. A pulse signal generating device as claimed in claim 1 wherein said pulse signal adjuster includes an off-time extending section for, when a detection is made, during an on-time of the pulse signal being currently output from said device, that the target duty cycle has presented a decrease from the current duty cycle by over the predetermined value, causing the pulse signal to rise at a predetermined point when time has passed from the pulse rise point immediately before the detection by an amount corresponding to a product between the on-time lasting up to time of the detection and a reciprocal of the target duty cycle.

* * * * *